US010103745B1

(12) United States Patent
Rodrigues de Campos et al.

(10) Patent No.: US 10,103,745 B1
(45) Date of Patent: Oct. 16, 2018

(54) CONTENT-AWARE COMPRESSION OF DATA USING SELECTION FROM MULTIPLE WEIGHTED PREDICTION FUNCTIONS

(71) Applicant: EMC IP Holding Company LLC, Hopkinton, MA (US)

(72) Inventors: Marcello Luiz Rodrigues de Campos, Niterói (BR); Rômulo Teixeira de Abreu Pinho, Niterói (BR); Angelo E. M. Ciarlini, Rio de Janeiro (BR); Alex Laier Bordignon, Rio de Janeiro (BR)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/363,328

(22) Filed: Nov. 29, 2016

(51) Int. Cl.
*G06F 7/483* (2006.01)
*H03M 7/30* (2006.01)

(52) U.S. Cl.
CPC .............. *H03M 7/30* (2013.01); *G06F 7/483* (2013.01)

(58) Field of Classification Search
None
See application file for complete search history.

(56) References Cited

U.S. PATENT DOCUMENTS

2015/0341653 A1* 11/2015 Ostrovskiy ............ H04N 19/50 382/190
2018/0026649 A1* 1/2018 Harik .................. G06N 99/005

OTHER PUBLICATIONS

Ciarlini et al., "Content-Aware Lossless Compression and Decompression of Floating Point Data", U.S. Appl. No. 14/579,130, filed Dec. 22, 2014.
Pinho et al., "Random Access to Compressed Data Using Bitwise Indices", U.S. Appl. No. 14/749,826, filed Jun. 25, 2015.
Pinho et al., "Distributed Content-Aware Compression and Decompression of Data", U.S. Appl. No. 14/867,329, filed Sep. 28, 2015.
Ciarlini et al., "Content-Aware Compression of Data Using Multiple Parallel Prediction Functions", U.S. Appl. No. 15/080,751, filed Mar. 25, 2015.

(Continued)

*Primary Examiner* — Michael D. Yaary
(74) *Attorney, Agent, or Firm* — Ryan, Mason & Lewis, LLP

(57) ABSTRACT

Methods and apparatus are provided for content-aware compression of data using selection from multiple weighted prediction functions. An exemplary method comprises obtaining a floating point number; applying a plurality of distinct prediction algorithms to the floating point number to generate a corresponding plurality of predictions; selecting at least one of the predictions for the floating point number based on combination weights for the plurality of distinct prediction algorithms, wherein the combination weights are based only on prior samples of the floating point numbers; and encoding the floating point number by encoding, as a single code, the exponent and the length of a residual generated by the distinct prediction algorithm associated with the selected at least one prediction. The combination weights are optionally updated for subsequent floating point numbers. A set of one or more predictors out of a larger set of predictors can be determined for a specific data set based on a data analysis ranking.

20 Claims, 6 Drawing Sheets

100
INPUT FILE 110
File Splitting 120
SegY Headers 125
Floating Point Data 130
SegY Header Compression 135
Data Analysis 140
Trailing Zeros
Trailing Zeros or Fraction Repetition Patterns Present? 150
Fraction Repetition Patterns
Apply Minimum-Length Compression Method 200 (FIG. 2) 160
Apply Alignment Compression Method 170
Compressed Floating Point Data 175
Compressed Headers 180
Packing 185
COMPRESSED 190

(56) References Cited

OTHER PUBLICATIONS

Ciarlini et al., "Content-Aware Compression of Data Using Window-Based Selection from Multiple Prediction Functions", U.S. Appl. No. 15/189,318, filed Jun. 22, 2016.
Mandyam et al., "Lossless seismic data compression using adaptive linear prediction", in Geoscience and Remote Sensing Symposium, 1996.
Arenas-Garcia et al., "Combinations of Adaptive Filters: Performance and convergence properties", IEEE Signal Processing Magazine, vol. 33, No. 1, pp. 120-140, 2016.
Elias, P., "Universal codeword sets and representations of the integers," Information Theory, IEEE Transactions on, vol. 21, No. 2, pp. 194-203, Mar. 1975.
Ciarlini et al., U.S. Appl. No. 14/230,510, "Heteroscedastic Data Compression Using Arima-Garch Model Estimation", filed Mar. 31, 2014.

* cited by examiner

CONTENT-AWARE COMPRESSION OF DATA USING SELECTION FROM MULTIPLE WEIGHTED PREDICTION FUNCTIONS

CROSS-REFERENCE TO RELATED APPLICATIONS

The present application is related to U.S. patent application Ser. No. 14/579,130 (now U.S. Pat. No. 9,660,666), filed Dec. 22, 2014, entitled "Content-Aware Lossless Compression and Decompression of Floating Point Data;" U.S. patent application Ser. No. 14/749,826 (now U.S. Pat. No. 9,503,123), filed Jun. 25, 2015, entitled "Random Access to Compressed Data Using Bitwise Indices;" U.S. patent application Ser. No. 14/867,329, filed Sep. 28, 2015, entitled "Distribution Content-Aware Compression and Decompression of Data;" U.S. patent application Ser. No. 15/080,751, filed Mar. 25, 2016, entitled "Content-Aware Compression of Data Using Multiple Parallel Prediction Functions;" and U.S. patent application Ser. No. 15/189,318 (now U.S. Pat. No. 9,954,550), filed Jun. 22, 2016, entitled "Content-Aware Compression of Data Using Window-Based Selection from Multiple Prediction Functions," each incorporated by reference herein.

FIELD

The field relates generally to compression and decompression of signal data, such as seismic data.

BACKGROUND

Data compression techniques are commonly used to achieve a low bit rate in the digital representation of signals for efficient processing, transmission, and storage. The size of seismic datasets, for example, continues to increase due to the need of extracting oil from more complex geologies. This drives demand for better sensor acquisition technologies, higher resolution hydrocarbon models, more iterations of analysis cycles, and increased integration of a broader variety of data types, all of which contribute to generating more and more data. Thus, seismic data compression has become important in geophysical applications, for efficient processing, storage and transmission of seismic data.

A number of techniques have been proposed for efficient lossless compression of seismic data. For example, U.S. patent application Ser. No. 14/579,130 (now U.S. Pat. No. 9,660,666), filed Dec. 22, 2014, entitled "Content-Aware Lossless Compression and Decompression of Floating Point Data," for example, discloses techniques for content-aware lossless compression and decompression of floating point data, such as seismic data, and other data. The disclosed content-aware lossless compression algorithms employ observed phenomena in the data to obtain improved compression ratios and processing speeds, relative to conventional techniques.

Nonetheless, a need remains for improved compression and decompression techniques.

SUMMARY

Illustrative embodiments of the present invention provide methods and apparatus for content-aware compression of data using selection from multiple weighted prediction functions. In one exemplary embodiment, a method for compressing at least one floating point number comprises obtaining the at least one floating point number represented using one or more bits to indicate a sign of the at least one floating point number and one or more additional bits to indicate an exponent at a given base and a significand of the at least one floating point number, wherein the significand has a length equal to a number of bits between a most significant bit of the significand and a least significant bit of the significand having a predefined binary value; applying a plurality of distinct prediction algorithms to the at least one floating point number to generate a corresponding plurality of predictions; selecting at least one of the plurality of predictions for the at least one floating point number based on combination weights for each of the plurality of distinct prediction algorithms, wherein the combination weights are based only on prior samples of the at least one floating point number; and encoding the at least one floating point number by encoding, as a single code, the exponent and the length of a residual generated by at least one of the distinct prediction algorithms associated with the selected at least one prediction.

In one or more embodiments, the exemplary method further comprises updating the combination weights for a subsequent floating point number, for example, using a normalized gradient-descent rule. The exemplary method optionally further comprises scaling each of the plurality of predictions and adding the scaled predictions to the combination weights for the plurality of distinct prediction algorithms; setting negative combination weights for the at least one floating point number to zero; dividing a vector of the combination weights for the at least one floating point number by a sum of elements of the vector; and/or applying the divided vector to an indicator function that selects the at least one of the plurality of predictions for the subsequent floating point number.

In at least one embodiment, the exemplary method further comprises determining a set of one or more prediction algorithms out of a larger set of prediction algorithms for a specific data set including the at least one floating point number based on an analysis of the specific data set; and/or selecting one of the plurality of predictions for one or more groups of floating point numbers.

In one exemplary embodiment, the exemplary method further comprises the steps of identifying one or more groups of floating point numbers in which the selecting at least one of the plurality of predictions for the at least one floating point number based on combination weights for each of the plurality of distinct prediction algorithms is locally outperformed by at least one other distinct compression method; and applying the at least one other distinct compression method to the one or more groups of floating point numbers. For example, the at least one other distinct compression method comprises a first multiple predictor method that selects predictors based on one or more of data segmentation and a disambiguation criterion; and/or a second window-based multiple predictor method that selects predictors based on an evaluation of one or more compression metrics considering an application of the predictors to a collection of floating point numbers within a window. Metadata is optionally stored to indicate the compression method applied to the one or more groups of floating point numbers.

Advantageously, illustrative embodiments of the invention provide improved compression and decompression of data, such as seismic data. These and other features and advantages of the present invention will become more readily apparent from the accompanying drawings and the following detailed description.

DETAILED DESCRIPTION

Figure 1:
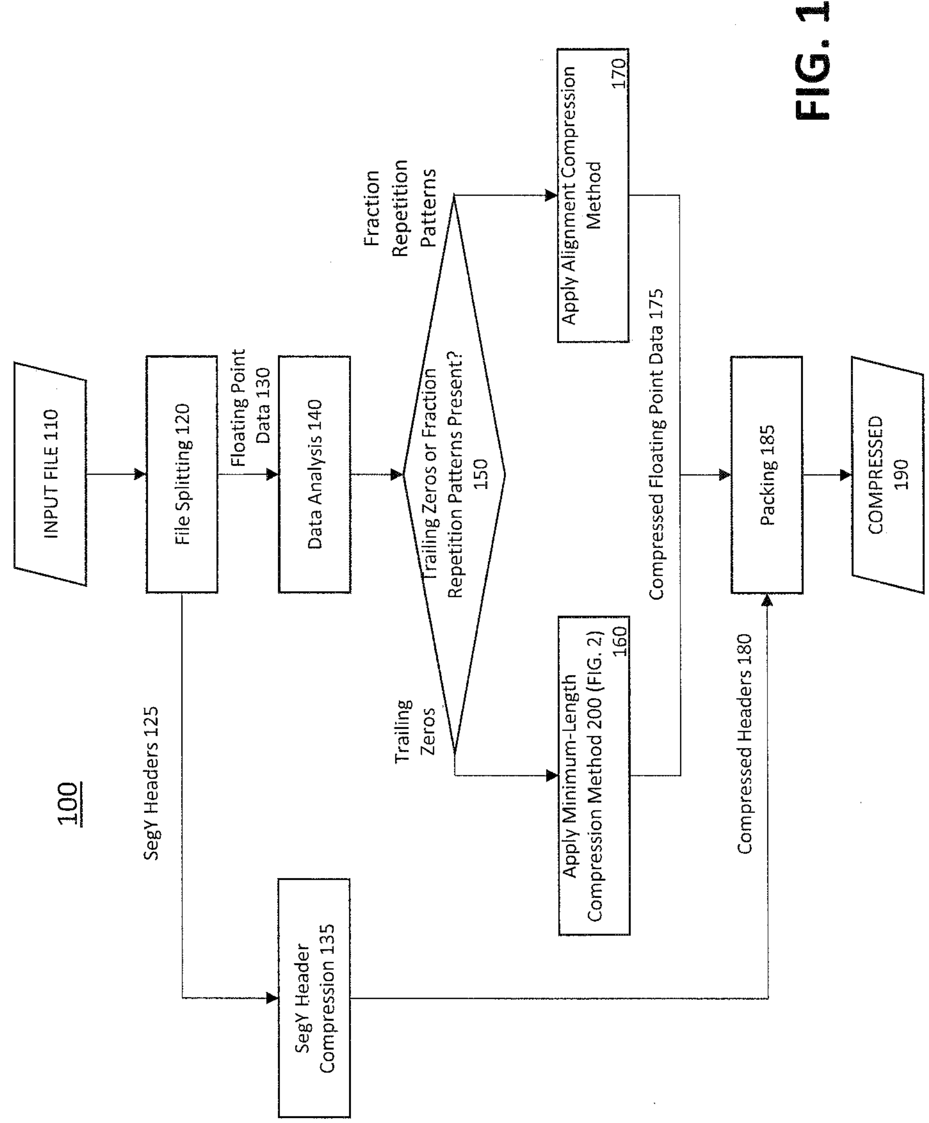
FIG. 1 is a flow chart illustrating an exemplary embodiment of a data compression process.

Illustrative embodiments of the present invention will be described herein with reference to exemplary communication, storage and processing devices. It is to be appreciated, however, that the invention is not restricted to use with the particular illustrative configurations shown. Aspects of the invention provide methods and apparatus for content-aware compression and decompression of data using selection from multiple weighted prediction functions. While the exemplary embodiments are described herein using seismic data, aspects of the present invention can be applied to other forms of data, as would be apparent to a person of ordinary skill in the art based on the present disclosure.

One or more embodiments of the invention select a suitable adaptive predictor among multiple predictors running in parallel, to improve the compression ratio in lossless compression of time series (e.g., seismic data) using prediction mechanisms. In one or more embodiments, the disclosed exemplary techniques combine multiple predictors using a gradient descent technique that automatically selects the "most suitable" predictor for samples in the time series data, without any bookkeeping. The disclosed method removes the need for exhaustive searches to determine the best predictor configuration for each data set.

One difficulty in using multiple predictors and choosing the best of them per sample lies in how to log information about such best predictor on a sample-by-sample basis. A naïve approach would spend $\lceil \log_2 N \rceil$ bits to choose between N predictors, rendering the combination of predictors ineffective. Data segmentation and a disambiguation criterion can optionally be employed to reduce the amount of bookkeeping per sample, with promising results.

Despite the promising results, in order to find the best predictor for each data segment, or even for every data sample, different predictors must be run in parallel, the compression results evaluated, and the overall "best" combination of predictors employed in the end. A pre-processing step with an exhaustive search for the best combination of predictors may yield very good performance, but at the expense of possibly being prohibitively time consuming. Choosing the best prediction with less computation while reducing the bookkeeping thus becomes a real challenge.

In at least one exemplary embodiment, the disclosed content-aware compression techniques are based on exemplary data compression algorithms, referred to herein as content-aware lossless compression algorithms, introduced in U.S. patent application Ser. No. 14/579,130 (now U.S. Pat. No. 9,660,666), filed Dec. 22, 2014, entitled "Content-Aware Lossless Compression and Decompression of Floating Point Data," incorporated by reference herein. The exemplary content-aware lossless compression algorithms provide a data oriented method for substantially lossless compression of floating point data, such as seismic data, and other data that employs observed phenomena in the data to obtain high compression ratios with fast algorithms. These data compression algorithms are modified as described herein to provide content-aware compression using selection from multiple weighted prediction functions.

The exemplary content-aware lossless compression algorithms comprise a minimal-length compression technique, discussed further below in conjunction with FIG. 2. The minimal-length compression technique classifies the samples so that codes describing both the exponent and the length of the significand can be used to keep only the necessary bits to represent each sample. The disclosed content-aware lossless compression algorithms are optionally combined with prediction models that aim at reducing the entropy of the data. A data analysis step is employed to decide which content-aware lossless compression algorithm is the best for each input dataset, as discussed further below in conjunction with FIG. 1. The minimal-length compression technique further provides versions for fast compression and decompression (Turbo Version) or for substantially maximum compression (Max Version).

One or more embodiments of the invention provide improved and efficient, content-aware compression and decompression of floating point data (e.g., seismic data) using selection from multiple weighted prediction functions. The aim is to compress the residual, or error, of the selected prediction of each time series sample, instead of the sample value itself, since good predictors tend to yield very small errors, which usually require fewer bits to be represented. In at least one embodiment, discussed further below, a plurality of predictors are employed in parallel in the Max Version of the minimal-length compression technique.

In one or more embodiments, the efficiency of the minimal-length compression process is improved, relative to the techniques described, for example, in U.S. patent application Ser. No. 14/579,130 (now U.S. Pat. No. 9,660,666), entitled "Content-Aware Lossless Compression and Decompression of Floating Point Data," by using selection from multiple weighted prediction functions.

While the exemplary embodiments employ the content-aware lossless compression algorithms as the compression algorithm, alternate compression algorithms, such as Huffman coding and Lempel-Ziv coding, or variations thereof, can be employed, as would be apparent to a person of ordinary skill in the art.

Content-Aware Lossless Compression Algorithms

FIG. 1 is a flow chart illustrating an exemplary implementation of a data compression process 100. The exemplary data compression process 100 processes seismic data stored in SegY files. Compression of other kinds of floating point data can be adapted from the exemplary embodiment, as would be apparent to a person of ordinary skill in the art. Overall, an input file 110 is split into SegY headers 125 and floating point data values 130 at a file splitting stage 120.

The SegY headers 125 are compressed during step 135, for example, with standard entropy encoders or with content-aware compression techniques, such as the techniques disclosed in U.S. patent application Ser. No. 14/867,329, filed Sep. 28, 2015, entitled "Distributed Content-Aware Compression and Decompression of Data."

The floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to substantially maximize performance.

A test is performed during step 150 to determine if trailing zeros or fraction repetition patterns are present in the input file 110. If it is determined during step 150 that trailing zeros are present, then program control proceeds to step 160 for compression using the minimal-length compression method 200 (FIG. 2) to process floating point data that can be trimmed. If, however, it is determined during step 150 that fraction repetition patterns are present, then program control proceeds to step 170 for compression using an exemplary alignment compression method. As discussed further below in conjunction with FIG. 2, the minimal-length compression method 200 can optionally be tuned for turbo or maximum compression.

Finally, compressed floating point data values 175 and compressed headers 180 are applied to a packing module during step 185, which organizes the compressed floating point data values 175 and compressed headers 180 in one or more compressed files 190 for access by a decompressor.

The algorithms for decompressing the compressed data are straightforward to a person of ordinary skill in the art, based on the discussion of the compression algorithms provided herein. The execution times of the decompression algorithms vary between 50% and 100% of the compression times. Thus, the remaining discussion focuses primarily on the description of the compression algorithms.

Min-Length Compression

Generally, as noted above, the minimal-length compression method 200 achieves fast compression through the efficient removal of trailing zeros from the least significant part of the significand of floating-point seismic samples. The algorithm exploits correlations between the exponents and the length of the significands of samples, which is the number of bits from the highest bit of the significand to the least significant bit 1 that precedes the trailing sequence of zeros. A cumulative histogram of classes represented by {exponent, length} classes is built and used to select those classes that will give the best compromise between bookkeeping and bit savings. Classes that are not initially part of the selected best classes are grouped and compete with the selected classes so that the best combination of individual classes and groups is obtained. The compression is performed in two steps through the data. In the first, the statistics about the samples are gathered, and the classes and groups are formed and selected. In the second step, the samples are classified and encoded according to the classes' specifications.

As discussed hereinafter, the exemplary minimal-length compression method 200 depends on a user-defined parameter, N>0, which is a superior limit for the number of output {exponent, length} classes. For each input sample, the method 200 writes to the compressed stream 1 bit to represent the sign of the sample, $\lceil \log_2 N \rceil$ bits for the class code associated with the sample, and a certain number of bits for the sample's significand, associated with the length derived from the sample's class.

Figure 2:
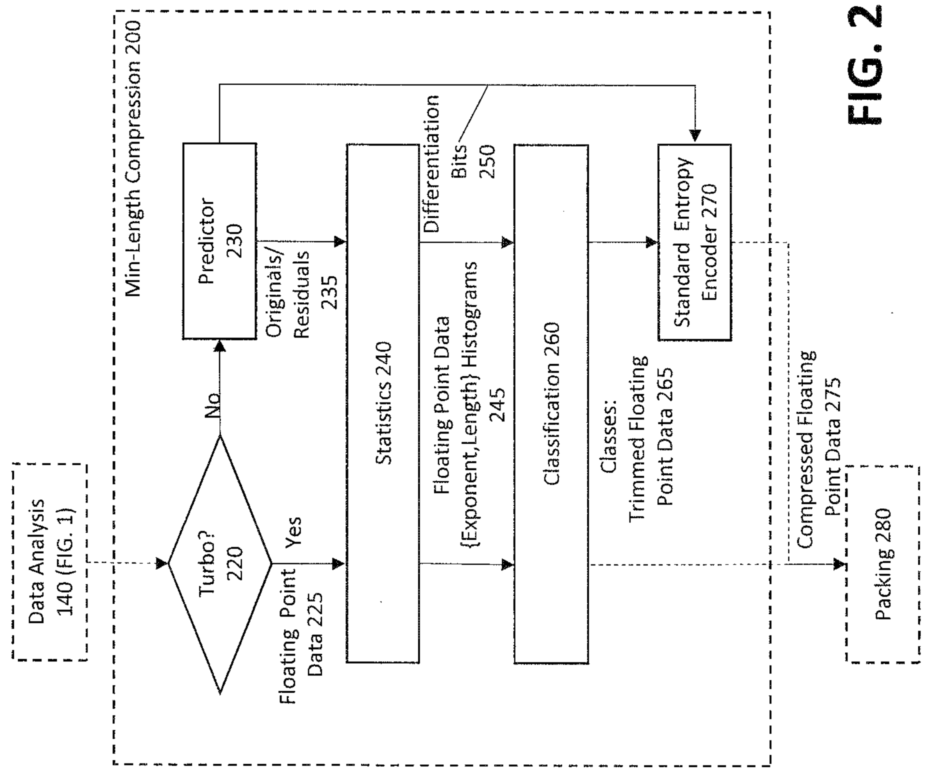
FIG. 2 is a flow chart illustrating an exemplary embodiment of a minimal-length compression method.

FIG. 2 is a flow chart illustrating an exemplary implementation of the minimal-length compression method 200. As previously indicated, the exemplary minimal-length compression method 200 compresses the input file 110 by removing unnecessary trailing zeros from significands. If zeros are removed from the original data, this information needs to be stored so that the original number can be rebuilt in the decompression phase, without data loss. Bookkeeping for such information for every sample can be costly and may result in poor compression performance. The exemplary minimal-length compression method 200 balances the removal of zeros and the bookkeeping. As discussed above, the minimal-length compression method 200 can optionally be tuned for turbo or maximal compression.

Thus, a test is performed during step 220 to determine if a turbo compression or a maximal compression will be performed. If it is determined during step 220 that a turbo compression will be performed, then program control proceeds directly to step 240 to process the floating point data 225.

The exemplary minimal-length compression method 200 works in two passes through the data. In the first pass, statistics on the lengths of the significands and their correlation with the corresponding exponents are gathered during step 240. The length of a significand is defined as the number of bits from the bit of highest order to the lowest order bit one preceding the sequence of trailing zeros. Every {exponent, length} pair is defined as a class and the statistics indicate how many bits can be saved if a specific code is created for that class and the trailing zeros of the significand of the samples of that class are removed. The output of the statistics phase 240 is a collection of histograms 245 of {exponent, length} pairs.

Given a (configurable) superior limit, N>0, to the number of classes to be represented, the exemplary minimal-length compression method 200 carries out a second pass through the input file 110 during step 260, removing zeros from samples of those classes in the histogram data 245 that will yield the best compression ratios in the trimmed floating point data 265. The referred superior limit N determines how many bits are necessary to store class codes associated with {exponent, length} pairs. The remaining classes are optionally grouped so that the highest number of zeros can be removed with the least amount of bookkeeping.

For classes associated with {exponent, length} pairs, let $B_c=\lceil \log_2 N \rceil$ be the number of bits necessary to store class codes, $B_s=1$ be the number of bits to store the sign of the floating point number, and $B_l$=length be the number of bits to store its significand. The classification of the samples during step 260 creates six types of classes:

- Classes that represent a single exponent and a single length: in this case, for each sample, $[B_s+B_c+(B_l-1)]$ bits are stored, since the least significant bit of the significand is known to be 1 and, as such, does not need to be stored.
- Classes that represent, for a single exponent, all lengths equal to or less than the length representative of the class: in this case, $[B_s+B_c+B_l]$ bits are stored for each sample (note that the least significant bit needs to be stored).
- Classes that combine consecutive exponents that can be aligned, having a substantially maximum length: in this case, $[B_s+B_c+B_l+1]$ bits are stored. Notice that the most significant bit 1 of the significand, which is hidden in the IEEE 754 format, has to be explicitly represented when numbers having different exponents are mixed, so that the alignment can be reverted upon decompression.

Classes that combine pairs of exponents that have different lengths: in this case, each sample can be represented by one extra bit that distinguishes the case of one exponent from the other and the corresponding length minus one bit, since the least significant bit does not need to be stored. Thus, $[B_s+B_c+B_l]$ bits are stored for each sample of these classes.

Classes that combine exponents that only have associated lengths of zero or one bit: in this case, no bits of the significand are stored, only a code with $B_z=\lceil \log_2 N_z \rceil$ bits (wherein $N_z$ is the total number of zero-length classes), which will enable the reconstruction of the class at the decompression time. Consequently, $[B_s+B_c+B_z]$ bits are stored.

Classes that handle exceptions: the IEEE 754 format specifies special binary codes for numbers that cannot be represented (also known as "not-a-number", or NaN). These are stored as members of the zero-length classes, in their original form (i.e., with 32 bits), with $[B_s+B_c+B_z+32]$ bits in total.

The size of the code is a (configurable) parameter of the minimal-length compression method 200, which may be defined as either 5 or 6 bits, for example.

If it is determined during step 220 that a maximal compression will be performed, then a prediction is performed during step 230, before program control proceeds to step 240 to process the original values and residual values 235. The variation of the minimal-length compression method 200 for maximum compression works in a similar manner as the turbo version described above. The difference is that a linear prediction algorithm is employed during step 230 to predict the value of every data sample based on a sequence of previous samples. A number of exemplary algorithms are available. See, for example, Monson H. Hayes, "9.4: Recursive Least Squares," Statistical Digital Signal Processing and Modeling, p. 541 (Wiley, 1996); G. Mandyam et al., "Lossless Seismic Data Compression Using Adaptive Linear Prediction," in Geoscience and Remote Sensing Symposium (1996); or U.S. patent application Ser. No. 14/230,510 (now U.S. Pat. No. 9,858,311), filed Mar. 31, 2014, entitled "Heteroscedastic Data Compression Using Arima-Garch Model Estimation," each incorporated by reference herein.

Generally, a linear prediction algorithm is employed during step 230 in order to use a prediction error, or residual, as the input for the compression algorithm, instead of the original data. Depending on the quality of the employed predictor, the residual can be very small. Consequently, it would need fewer significant bits to be represented, in comparison with the original data, resulting in more effective compression. Adaptive linear prediction (in which prediction coefficients are updated with the execution of the algorithm) provides a good compromise between prediction power and speed of execution.

In the case of floating point data, the residual could have a longer length, even if its absolute value is lower than that of the original value. To ensure that the residual values demand fewer bits than the original values, the following strategy is adopted in the exemplary embodiment:

During compression, the prediction and the original value are aligned to the same exponent, and the prediction is truncated at the bit that precedes the least significant bit 1 of the original value. By doing this, the least significant bit of the residual will be the least significant bit 1 of the original value when they are aligned. If the absolute value of the residual is lower than that of the original value, its length is equal to or shorter than that of the original value when the exponents are restored.

During decompression, the residual value is aligned with the prediction (which is the same prediction originated at compression time) and the prediction is truncated at the bit that precedes the least significant bit 1 of the residual. The residual is then added to the prediction in order to exactly obtain the original value.

On average, it has been observed that residuals are indeed "shorter" than the original data samples. In order to improve the compression ratios even further, the residual is replaced with the original sample whenever the former needs, in reality, more bits to be represented. In one or more embodiments, only one bit of bookkeeping, referred to in FIG. 2 as a differentiation bit 250, is necessary to differentiate between the two types, therefore with minimal impact. As the frequency in which residuals are longer than the original values is low, the compression of this optional differentiation bit 250 is very high, so that this differentiation tends to increase compression ratio.

In the maximum compression mode, the class codes and trimmed floating point data 265 generated by the classification 260 and the differentiation bits 250 are further processed using an entropy encoder 270, in a known manner.

Finally, compressed floating point data values 275 are applied to a packing module during step 280, which organizes the compressed floating point data values 275 in one or more compressed files for access by a decompressor.

Improving Compression Ratios Using Multiple Predictors

As noted above, one or more embodiments of the invention achieve improved compression ratios in substantially lossless compression of floating-point data (e.g., seismic data), using multiple prediction mechanisms. Such mechanisms interpret the floating-point numbers in seismic data as time series and employ methods to predict the value of a sample based on the values of past samples. In the end, the residual (or error) of the prediction is compressed, instead of the original time series value. The general intuition is that a good predictor yields very small errors, which in turn require fewer bits to be represented, reducing the overall entropy of the data to be compressed.

In one or more embodiments, the efficiency of the minimal-length compression process is improved, relative to the techniques described in U.S. patent application Ser. No. 14/579,130 (now U.S. Pat. No. 9,660,666), entitled "Content-Aware Lossless Compression and Decompression of Floating Point Data," using selection from multiple weighted prediction functions.

One or more embodiments of the invention find a substantially most suitable predictor configuration for each sample using a minimization of a cost function, which itself depends only on past data. While perhaps not yielding the absolute best configuration on a sample-by-sample basis, this strategy gives the decoder the ability to infer the values of the combination weights on its own, without any bookkeeping. Namely, given that previous data samples have been correctly reconstructed, the decoder is able to calculate the same combination of predictors used at the encoder in order to reconstruct the current data sample.

The referred minimization is carried out with respect to the weights used to combine the predictors operating in parallel. The substantially best predictor for a particular sample, which will be used to provide the final predictor output, is the one associated with the combination weight with the largest magnitude. In one or more embodiments, the disclosed method does not require any bookkeeping of the predictor index, therefore resulting in potential gains in the overall compression ratios with respect to strategies that require sending the predictor index together with the encoded data.

Convex Combination of Predictors

Assume that N predictions of sample $s_i$ are available, herein called outputs $y_{ij}$, j=1, 2, . . . , N. The final output $y_i$ shall be the result of a linear combination of the N individual outputs $y_{ij}$. A residue can then be calculated as follows:

$$e_i = s_i - y_i = s_i - l_i^T y_i,$$

where $l_i$ is a vector with the corresponding combination weights $l_{ij}$, where $l_{ij} \in [0, 1]$, and $y_i$ is the vector containing all partial individual outputs $y_{ij}$.

In one or more embodiments, the vector is updated with weights to be used for the next sample, $l_{i+1}$, following a normalized gradient-descent rule. See, for example, J. Arenas-Garcia et al., "Combinations of Adaptive Filters: Performance and Convergence Properties," *IEEE Signal Processing Magazine*, Vol. 33, No. 1, 120-140 (2016), incorporated by reference herein in its entirety. The corresponding cost function to be minimized is defined as $\xi = \|l_{i+1} - l_i\|_2^2$ subject to the constraint that the a posteriori residue, $\varepsilon_i = s_i - l_{i+1}^T y_i$, be equal to zero, i.e., $\varepsilon_i = 0$. The solution is obtained with the aid of the Lagrangian function associated with the constrained minimization problem, constructed as follows:

$$\xi' = \xi + v\varepsilon_i,$$

where v is referred to as the Lagrange multiplier. Taking the derivative of the equation above with respect to $l_{i+1}$ and making the result equal to zero, the following expression is obtained:

$$2l_{i+1} - 2l_i - vy_i = 0.$$

If the above expression is pre-multiplied by $y_i^T$ on both sides and the constraint $\varepsilon_i = 0$ is used, the value of the Lagrange multiplier can be calculated as follows:

$$v = \frac{2e_i}{y_i^T y_i},$$

and finally the solution for updating the vector of the combination coefficients (for the next sample) is obtained, as follows:

$$l_{i+1} = l_i + \frac{e_i}{y_i^T y_i} y_i.$$

Notice that, in the above equation, no posterior information is required. In order to improve performance and robustness, the equation above can be slightly modified as follows:

$$l_{i+1} = l_i + \frac{\mu e_i}{y_i^T y_i + \eta} y_i,$$

where μ is the step size, usually equal to 1, and η is a small regularization factor introduced to avoid division by zero. As negative weights are meaningless, if the result of the equation above becomes negative for any element j in the vector $l_{i+1}$, one or more embodiments set $l_{i+1,j} = 0$. In one or more embodiments, the combination weight vector is also divided by the sum of its elements in order to obtain a convex combination of predictors, i.e., $l_{ij} \in [0, 1]$.

Choice of a Single Predictor Based on the Convex Combination

Instead of combining predictor outputs, the algorithm could optionally select one which supposedly approximates $s_i$ better. Assume, as before, that a set of N predictors is available, producing different outputs $y_{ij}$, j=1, 2, . . . , N. The final predictor output, $y_i$, is chosen as the output of the predictor with the substantially largest weight $l_{ij}$ among the N individual predictor outputs, $y_{ij}$. In this case, the residue is calculated as $$e_i = s_i - y_i = s_i - a_i^T y_i,$$

where $a_i = \mathrm{l}(l_i)$, and $\mathrm{l}(l_i)$ an indicator function whose outcome is a vector with all elements equal to zero, except the element at the position given by $\max_j(|l_{i,j}|)$, which is equal to 1, and $y_i$ is the vector containing all partial individual outputs $y_{ij}$, as before.

The indicator vector to be used for the next sample, $a_{i+1}$, is updated. The corresponding cost function to be substantially minimized is defined as $\xi = \|l_{i+1} - a_i\|_2^2$ subject to the constraint that the a posteriori residue, $\varepsilon_i = s_i - l_{i+1}^T y_i$, be equal to zero, i.e., $\varepsilon_i = 0$. The solution is $$l_{i+1} = a_i + \frac{\mu e_i}{y_i^T y_i + \eta} y_i,$$

where μ and η are used as in the previous case. Likewise, negative weights are optionally set to zero, and the resulting set is optionally normalized into [0, 1].

Choosing the Best Predictor

Based on extensive simulations, an exemplary algorithm is disclosed for the choice of the most suitable predictor as a combination of the two schemes described in the subsections above. Namely, the weight update function defined in the section entitled "Convex Combination of Predictors" is used; and the indicator function defined in the section entitled "Choice of a Single Predictor Based on the Convex Combination" is employed to choose the best predictor for each sample of the data set. As such, the residue for a sample $s_i$ is calculated as follows:

$$e_i = s_i - y_i = s_i - a_i^T y_i,$$

where $a_i = \mathrm{l}(l_i)$ and $y_i$ are defined as before. In turn, the vector with combination weights of the convex combination is updated according to the following rule:

$$l_{i+1} = l_i + \frac{\mu e_i}{y_i^T y_i + \eta} y_i,$$

where μ and η are also defined as before, negative weights are optionally set to zero, and the resulting set is optionally normalized into [0, 1].

Selection From Multiple Weighted Prediction Functions

Figure 3:
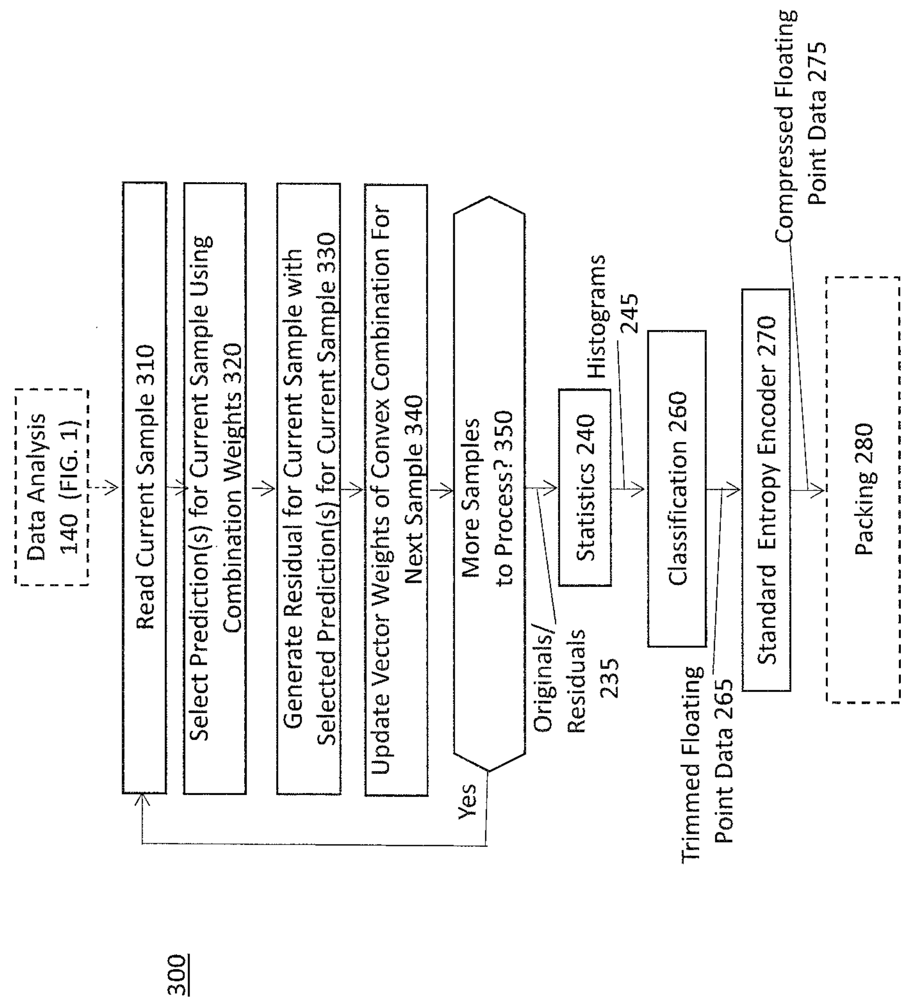
FIG. 3 is a flow chart illustrating an exemplary implementation of a process for the max version of the minimal-length compression method of FIG. 2 that employs selection from multiple weighted prediction functions, in accordance with an embodiment of the invention.

FIG. 3 is a flow chart illustrating an exemplary implementation of a compression process 300 for the Max Version of the minimal-length compression method of FIG. 2 that employs selection from multiple weighted prediction functions, in accordance with an embodiment of the invention. As discussed above in conjunction with FIG. 1, the floating point data values 130 are processed during step 140 to determine which compression technique 200 is the best for the input file 110, and will follow one of two possible workflows. The data analysis 140 can be carried out on random, small subsets of the input file 110. Statistics on the length of significands of floating point data and on repetition patterns are obtained and ranked. By dividing the input file 110 into chunks, the choice of the compression workflow can optionally be optimized on a chunk-by-chunk basis, enabling the compression of several chunks to be executed in parallel, to improve performance.

In one or more embodiments, the particular predictors in the set B are chosen after an analysis of a statistically significant portion of the data to be compressed. Thus, a pre-processing step is optionally performed during step 140 to select the best predictors to use for the data set, as discussed above in a section entitled "Best Combination of Predictors." In addition, a default predictor is optionally selected during step 140 for the data set.

During step 310, the current sample is read. Thereafter, the compression process 300 selects one or more predictions for the current sample using the combination weights during step 320, and generates a residual for the current sample with the one or more selected predictions for the current sample during step 330. The vector weights of the convex combination are updated for the next sample during step 340, as discussed above.

A test is performed during step 350 to determine if there are more samples to process. If it is determined during step 350 that there are more samples to process, then program control returns to step 310 to process the remaining samples. If, however, it is determined during step 350 that there are no more samples to process, then program control proceeds to step 240 and continues in a similar manner as FIG. 2.

Figure 4:
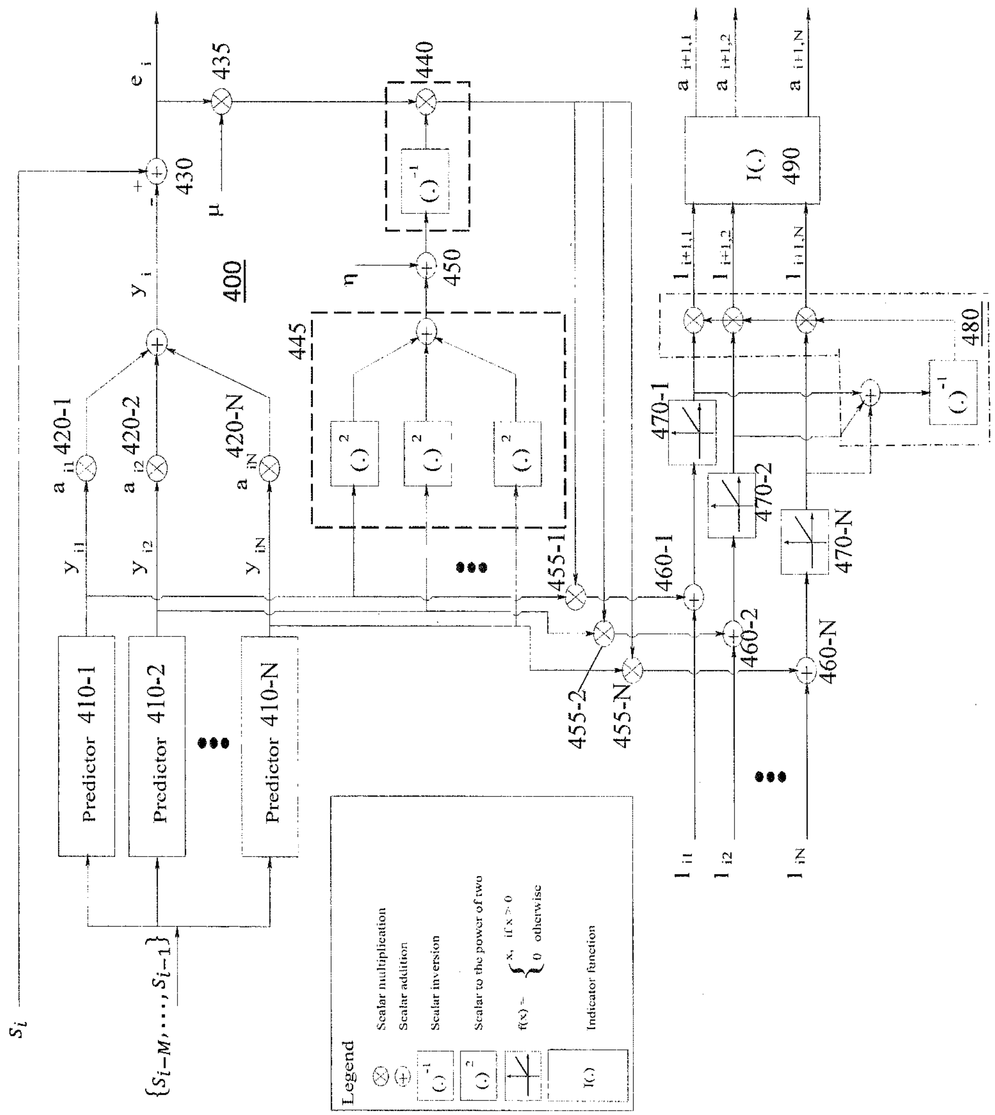
FIG. 4 illustrates a circuit diagram of an encoder for content-aware compression of data using selection from multiple weighted prediction functions, according to one embodiment of the invention.

FIG. 4 illustrates a circuit diagram of an encoder 400 for content-aware compression of data using selection from multiple weighted prediction functions, according to one embodiment of the invention. As shown in FIG. 4, the inputs of the encoder 400 are the set of previous samples, $\{s_{i-M}, \ldots s_{i-1}\}$, the current sample to be estimated, or predicted, $s_i$, the set of combination weights, $\{l_{i1}, \ldots l_{iN}\}$, the step size $\mu$, and the regularization factor, $\eta$. The outputs of the predictors 410-1 through 410-N, $y_{ij}$, are fed through corresponding multipliers, $a_{ij}$ 420-1 through 420-N, which are all equal to zero, except one, which indicates the chosen predictor.

The residue is then calculated at adder 430 as the difference between $s_i$ and the output of the chosen predictor. The residue is also used to update the multipliers $a_{ij}$ for the next sample, as follows. The residue is scaled by $\mu$, using multiplier 435 and divided, using multiplier 440, by the sum of the squares 445 of the individual predictor outputs, regularized at adder 450 by the regularization factor, $\eta$. Alternatively, the residue, scaled by $\mu$, is normalized by the addition of the regularization factor $\eta$ and the square of the Euclidean norm of the vector containing the predictor outputs.

The output value from multiplier 440 is then used to scale each individual predictor output using multipliers 455-1 through 455-N, and the results are added to the corresponding combination weights, $l_{ij}$, previously calculated and made available as inputs to the encoder 400, using adders 460-1 through 460-N. The results are the updated combination weights, $l_{i+1,j}$. These weights, $l_{i+1,j}$, are modified at stage 470, such that any negative entry is forced to be zero. The resulting vector is divided by the sum of its elements at stage 480 and fed to the indicator function 490, producing the multipliers $a_{i+1,j}$ to be used in the next iteration to choose the predictor output.

Initializing the Predictor Set

It can be shown the disclosed compression method using selection from multiple weighted prediction functions, as described herein, tends to be robust to poor choices of predictors being combined, meaning that the disclosed method tends to favor the best performing predictor on average from within the set of predictors being combined. On the other hand, the performance of the combination potentially improves any individual predictor in the predictor set if the predictors to be combined are a good fit for the data.

One or more embodiments of the disclosed compression method using selection from multiple weighted prediction functions employ an initialization step in which the set of N predictors to be combined is built from a small set of data points (such as 1% of the dataset) using one or more mechanisms. For example, one such mechanism could be an analysis of the auto-correlation, the local variance of the time series samples, or any other data feature that might be related to the parameters of the predictors being employed.

Isolating Parts of the Data Set and Combining with Other Strategies

It has been found that, sometimes, when the signal becomes very unstable, the detection of the best predictor using the disclosed method tends to be difficult. As a consequence, the disclosed method can optionally be further combined with other techniques so that they can yield even higher compression ratios. Essentially, blocks are isolated with a minimum of S samples (so that the associated bookkeeping is minimal) and one or more of the following exemplary strategies is applied:

- choosing one of predictors being combined as the only one to be considered for that block;
- finding a substantially absolute best predictor per sample while employing anyone or more techniques disclosed in U.S. patent application Ser. No. 15/080,751, filed Mar. 25, 2015, entitled "Content-Aware Compression of Data Using Multiple Parallel Prediction Functions;" and/or
- leveraging information about future data samples to choose the predictor to be applied to small blocks, as disclosed in U.S. patent application Ser. No. 15/189,318 (now U.S. Pat. No. 9,954,550), filed Jun. 22, 2016, entitled "Content-Aware Compression of Data Using Window-Based Selection from Multiple Prediction Functions."

In this context, the combination of predictors could be switched on or off depending on its performance within certain data regions, with minimal bookkeeping.

Thus, one or more embodiments of the disclosed compression method using selection from multiple weighted prediction functions comprise the steps of identifying one or more groups of floating point numbers in which the selecting at least one of the plurality of predictions for the at least one floating point number based on combination weights for each of the plurality of distinct prediction algorithms is locally outperformed by at least one other distinct compression method; and applying the at least one other distinct compression method to the one or more groups of floating point numbers (for example, by storing metadata to indicate the compression method applied to the one or more groups of floating point number). The at least one other distinct compression method comprises one or more of a first multiple predictor method that employs one or more of data segmentation and a disambiguation criterion and a second multiple predictor method that employs information about future time series samples.

In one or more embodiments, the present compression techniques (using selection from multiple weighted prediction functions based only on prior samples) are employed in some regions, while any of the alternative techniques in U.S. patent application Ser. No. 15/080,751 or U.S. patent application Ser. No. 15/189,318 (now U.S. Pat. No. 9,954,550) can be employed in other regions where such alternative techniques outperform the present compression techniques.

EXAMPLES

It has been found that the results obtained with the disclosed methods vary according to the complexity of the data sets. Various experiments have shown, with respect to the combination of predictors, the following:

1) the disclosed method is able to automatically provide an indication of the most suitable predictor per sample;

2) the disclosed method potentially improves the performance of any individual predictor in the set of predictors to be combined;

3) the disclosed method is robust to occasional poor choices of predictors for the set of predictors.

CONCLUSION

One or more embodiments of the invention provide methods and apparatus for content-aware compression of data using selection from multiple weighted prediction functions. In one or more embodiments, a data compression method is provided that uses a substantially "best" RLS (Recursive Least Squares) predictor, out of a set of predictors with different configurations, to compress each sample of time series data, in particular, of seismic data. In at least one embodiment, the "best" predictor is identified by finding the best predictor in a convex combination of predictors that complement each other for a particular data set. It has been found that a combination of predictors that perform well for various datasets can yield results that are better than or similar to an exhaustive search for a single best predictor for the whole specific data set.

The foregoing applications and associated embodiments should be considered as illustrative only, and numerous other embodiments can be configured using the techniques disclosed herein, in a wide variety of different applications.

It should also be understood that the disclosed techniques for content-aware compression of data using selection from multiple weighted prediction functions, as described herein, can be implemented at least in part in the form of one or more software programs stored in memory and executed by a processor of a processing device such as a computer. As mentioned previously, a memory or other storage device having such program code embodied therein is an example of what is more generally referred to herein as a "computer program product."

The disclosed techniques for content-aware compression of data using selection from multiple weighted prediction functions may be implemented using one or more processing platforms. One or more of the processing modules or other components may therefore each run on a computer, storage device or other processing platform element. A given such element may be viewed as an example of what is more generally referred to herein as a "processing device."

Figure 5:
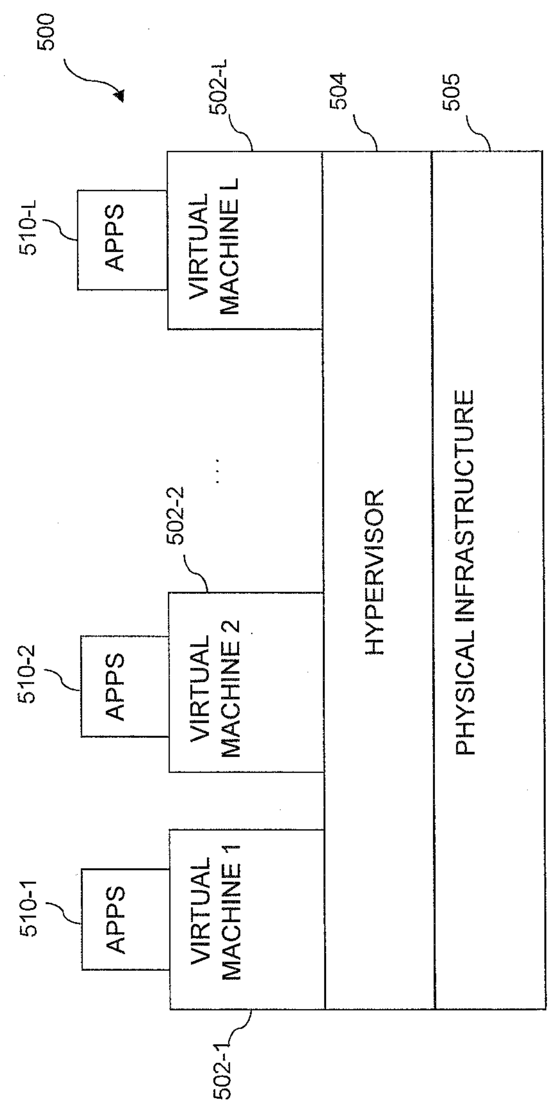
FIG. 5 illustrates an exemplary processing platform that may be used to implement at least a portion of one or more embodiments of the invention comprising a cloud infrastructure.

Referring now to FIG. 5, one possible processing platform that may be used to implement at least a portion of one or more embodiments of the invention comprises cloud infrastructure 500. The cloud infrastructure 500 in this exemplary processing platform comprises virtual machines (VMs) 502-1, 502-2, . . . 502-L implemented using a hypervisor 504. The hypervisor 504 runs on physical infrastructure 505. The cloud infrastructure 500 further comprises sets of applications 510-1, 510-2, . . . 510-L running on respective ones of the virtual machines 502-1, 502-2, . . . 502-M under the control of the hypervisor 504.

The cloud infrastructure 500 may encompass the entire given system or only portions of that given system, such as one or more of client, servers, controllers, or computing devices in the system.

Although only a single hypervisor 504 is shown in the embodiment of FIG. 5, the system may of course include multiple hypervisors each providing a set of virtual machines using at least one underlying physical machine.

An example of a commercially available hypervisor platform that may be used to implement hypervisor 504 and possibly other portions of the system in one or more embodiments of the invention is the VMware® vSphere™ which may have an associated virtual infrastructure management system, such as the VMware® vCenter™. The underlying physical machines may comprise one or more distributed processing platforms that include storage products, such as VNX™ and Symmetrix VMAX™, both commercially available from EMC Corporation of Hopkinton, Mass. A variety of other storage products may be utilized to implement at least a portion of the system.

In some embodiments, the cloud infrastructure additionally or alternatively comprises a plurality of containers implemented using container host devices. For example, a given container of cloud infrastructure illustratively comprises a Docker container or other type of LXC. The containers may be associated with respective tenants of a multi-tenant environment of the system, although in other embodiments a given tenant can have multiple containers. The containers may be utilized to implement a variety of different types of functionality within the system. For example, containers can be used to implement respective compute nodes or cloud storage nodes of a cloud computing and storage system. The compute nodes or storage nodes may be associated with respective cloud tenants of a multi-tenant environment of system. Containers may be used in combination with other virtualization infrastructure such as virtual machines implemented using a hypervisor.

Figure 6:
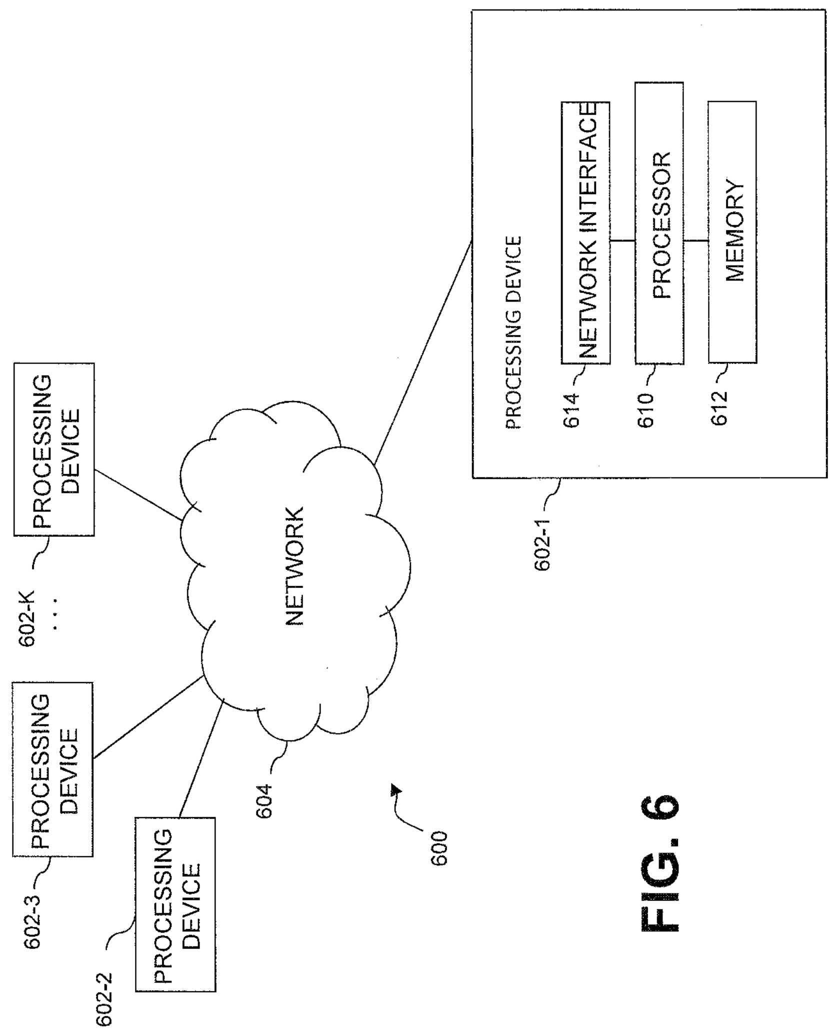
FIG. 6 illustrates another exemplary processing platform that may be used to implement at least a portion of one or more embodiments of the invention.

Another example of a processing platform is processing platform 600 shown in FIG. 6. The processing platform 600 in this embodiment comprises at least a portion of the given system and includes a plurality of processing devices, denoted 602-1, 602-2, 602-3, . . . 602-K, which communicate with one another over a network 604. The network 604 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 602-1 in the processing platform 600 comprises a processor 610 coupled to a memory 612. The processor 610 may comprise a microprocessor, a microcontroller, an application specific integrated circuit (ASIC), a field programmable gate array (FPGA) or other type of processing circuitry, as well as portions or combinations of such circuitry elements, and the memory 612, which may be viewed as an example of a "computer program product" having executable computer program code embodied therein, may comprise random access memory (RAM), read only memory (ROM) or other types of memory, in any combination.

Also included in the processing device 602-1 is network interface circuitry 614, which is used to interface the processing device with the network 604 and other system components, and may comprise conventional transceivers.

The other processing devices 602 of the processing platform 600 are assumed to be configured in a manner similar to that shown for processing device 602-1 in the figure.

Again, the particular processing platform 600 shown in the figure is presented by way of example only, and the given system may include additional or alternative processing platforms, as well as numerous distinct processing platforms in any combination, with each such platform comprising one or more computers, storage devices or other processing devices.

Multiple elements of system may be collectively implemented on a common processing platform of the type shown in FIG. 5 or 6, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

Also, it should again be emphasized that the above-described embodiments of the invention are presented for purposes of illustration only. Many variations and other alternative embodiments may be used. For example, the disclosed techniques are applicable to a wide variety of other types of communication systems, storage systems and processing devices. Accordingly, the particular illustrative configurations of system and device elements detailed herein can be varied in other embodiments. These and numerous other alternative embodiments within the scope of the appended claims will be readily apparent to those skilled in the art.

What is claimed is:

1. A method for compressing at least one floating point number, comprising the steps of:

obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using at least one processing device, a plurality of distinct prediction algorithms to said at least one floating point number to generate a corresponding plurality of predictions;

selecting, using the at least one processing device, at least one of said plurality of predictions for said at least one floating point number based on combination weights for each of said plurality of distinct prediction algorithms, wherein said combination weights are based substantially only on prior samples of said at least one floating point number; and encoding, using the at least one processing device, said at least one floating point number by encoding, as a single code, said exponent and said length of a residual generated by at least one of said distinct prediction algorithms associated with said selected at least one prediction.

2. The method of claim 1, further comprising the step of updating said combination weights for a subsequent floating point number.

3. The method of claim 2, wherein said updating employs a normalized gradient-descent rule.

4. The method of claim 2, further comprising the steps of scaling each of said plurality of predictions and adding said scaled predictions to said combination weights for said plurality of distinct prediction algorithms.

5. The method of claim 2, further comprising one or more steps of setting negative combination weights for said at least one floating point number to zero; dividing a vector of said combination weights for said at least one floating point number by a sum of elements of said vector; and applying said divided vector to an indicator function that selects said at least one of said plurality of predictions for said subsequent floating point number.

6. The method of claim 1, wherein said selection is based on a magnitude of said combination weights.

7. The method of claim 1, further comprising the step of determining a set of one or more prediction algorithms out of a larger set of prediction algorithms for a specific data set including said at least one floating point number based on an analysis of said specific data set.

8. The method of claim 7, wherein said analysis of said specific data set comprises one or more of an auto-correlation and a local variance of time series of floating point numbers.

9. The method of claim 1, further comprising the step of selecting one of said plurality of predictions for one or more groups of floating point numbers.

10. The method of claim 1, further comprising the steps of identifying one or more groups of floating point numbers in which said selecting at least one of said plurality of predictions for said at least one floating point number based on combination weights for each of said plurality of distinct prediction algorithms is locally outperformed by at least one other distinct compression method; and applying said at least one other distinct compression method to said one or more groups of floating point numbers.

11. The method of claim 10, wherein said at least one other distinct compression method comprises one or more of a first multiple predictor method that selects predictors based on one or more of data segmentation and a disambiguation criterion and a second window-based multiple predictor method that selects predictors based on an evaluation of one or more compression metrics considering an application of said predictors to a collection of floating point numbers within a window.

12. The method of claim 10, wherein said applying said at least one other distinct compression method to said one or more groups of floating point numbers comprises storing metadata to indicate the compression method applied to said one or more groups of floating point numbers.

13. A computer program product for compressing at least one floating point number, comprising a tangible machine-readable storage medium having encoded therein executable code of one or more software programs, wherein the one or more software programs when executed by at least one processing device perform the following steps:

obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using the at least one processing device, a plurality of distinct prediction algorithms to said at least one floating point number to generate a corresponding plurality of predictions;

selecting, using the at least one processing device, at least one of said plurality of predictions for said at least one floating point number based on combination weights for each of said plurality of distinct prediction, algorithms, wherein said combination weights are based substantially only on prior samples of said at least one floating point number; and encoding, using the at least one processing device, said at least one floating point number by encoding, as a single code, said exponent and said length of a residual generated by at least one of said distinct prediction algorithms associated with said selected at least one prediction.

14. A system for compressing at least one floating point number, comprising:

a memory; and at least one processing device, coupled to the memory, operative to implement the following steps:

obtaining said at least one floating point number represented using one or more bits to indicate a sign of said at least one floating point number and one or more additional bits to indicate an exponent at a given base and a significand of said at least one floating point number, wherein said significand has a length equal to a number of bits between a most significant bit of said significand and a least significant bit of said significand having a predefined binary value;

applying, using the at least one processing device, a plurality of distinct prediction algorithms to said at least one floating point number to generate a corresponding plurality of predictions;

selecting, using the at least one processing device, at least one of said plurality of predictions for said at least one floating point number based on combination weights for each of said plurality of distinct prediction algorithms, wherein said combination weights are based substantially only on prior samples of said at least one floating point number; and encoding, using the at least one processing device, said at least one floating point number by encoding, as a single code, said exponent and said length of a residual generated by at least one of said distinct prediction algorithms associated with said selected at least one prediction.

15. The system of claim 14, further comprising the step of updating said combination weights for a subsequent floating point number.

16. The system of claim 15, further comprising one or more steps of scaling each of said plurality of predictions and adding said scaled predictions to said combination weights for said plurality of distinct prediction algorithms; setting negative combination weights for said at least one floating point number to zero; dividing a vector of said combination weights for said at least one floating point number by a sum of elements of said vector; and applying said divided vector to an indicator function that selects said at least one of said plurality of predictions for said subsequent floating point number.

17. The system of claim 14, wherein said selection is based on a magnitude of said combination weights.

18. The system of claim 14, further comprising the step of determining a set of one or more prediction algorithms out of a larger set of prediction algorithms for a specific data set including said at least one floating point number based on an analysis of said specific data set.

19. The system of claim 14, further comprising the step of selecting one of said plurality of predictions for one or more groups of floating point numbers.

20. The system of claim 14, further comprising the steps of identifying one or more groups of floating point numbers in which said selecting at least one of said plurality of predictions for said at least one floating point number based on combination weights for each of said plurality of distinct prediction algorithms is locally outperformed by at least one other distinct compression method; and applying said at least one other distinct compression method to said one or more groups of floating point numbers.

* * * * *